(12) United States Patent
Yasutomi et al.

(10) Patent No.: US 10,224,257 B2
(45) Date of Patent: Mar. 5, 2019

(54) SEMICONDUCTOR MODULE

(71) Applicant: Mitsubishi Electric Corporation, Tokyo (JP)

(72) Inventors: Goro Yasutomi, Fukuoka (JP); Kazuhiro Morishita, Fukuoka (JP); Ryutaro Date, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/533,327

(22) PCT Filed: Jan. 27, 2015

(86) PCT No.: PCT/JP2015/052190
§ 371 (c)(1),
(2) Date: Jun. 5, 2017

(87) PCT Pub. No.: WO2016/120997
PCT Pub. Date: Aug. 4, 2016

(65) Prior Publication Data
US 2017/0345729 A1    Nov. 30, 2017

(51) Int. Cl.
*H01L 23/24* (2006.01)
*H01L 23/28* (2006.01)
(Continued)

(52) U.S. Cl.
CPC ............ *H01L 23/24* (2013.01); *H01L 23/142* (2013.01); *H01L 23/16* (2013.01); *H01L 23/28* (2013.01);
(Continued)

(58) Field of Classification Search
CPC combination set(s) only.
See application file for complete search history.

(56) References Cited

U.S. PATENT DOCUMENTS 5,744,860 A    4/1998  Bayerer
6,201,696 B1 *  3/2001  Shimizu ................. H01L 23/24
                                                            361/704
(Continued)

FOREIGN PATENT DOCUMENTS

CN    1219767 A      6/1999
EP    0 384 482 B1   8/1995
(Continued)

OTHER PUBLICATIONS

International Search Report issued in PCT/JP2015/052190; dated May 12, 2015.
(Continued)

*Primary Examiner* — Ratisha Mehta
(74) *Attorney, Agent, or Firm* — Studebaker & Brackett PC

(57) ABSTRACT

It is an object of the present invention to provide a semiconductor module that reduces an excessive stress on a sealed object due to the expansion and contraction of a sealing gel to thus improve the reliability. A semiconductor module according to the present invention includes: a semiconductor element bonded to a metal pattern on an insulating substrate contained in a case; a sealing gel sealing the insulating substrate and the semiconductor element within the case; and a sealing-gel-expansion suppressing plate disposed in the upper portion of the sealing gel to be at least partially in contact with the sealing gel. The sealing-gel-expansion suppressing plate includes a surface facing the sealing gel and inclined to the upper surface of the sealing gel.

14 Claims, 8 Drawing Sheets

(51) Int. Cl.
  *H01L 25/07* (2006.01)
  *H01L 25/18* (2006.01)
  *H01L 23/14* (2006.01)
  *H01L 23/532* (2006.01)
  *H01L 23/16* (2006.01)
  *H01L 23/528* (2006.01)
  *H01L 23/00* (2006.01)

(52) U.S. Cl.
  CPC ........ *H01L 23/53228* (2013.01); *H01L 25/07* (2013.01); *H01L 25/18* (2013.01); *H01L 23/5283* (2013.01); *H01L 23/562* (2013.01); *H01L 2224/48137* (2013.01)

(56) References Cited

U.S. PATENT DOCUMENTS

| | | | |
|---|---|---|---|
| 6,597,063 | B1 | 7/2003 | Shimizu et al. |
| 6,791,174 | B2 | 9/2004 | Matsuo et al. |
| 2003/0089974 | A1 | 5/2003 | Matsuo et al. |
| 2015/0049005 | A1* | 2/2015 | Choi .................. G09G 3/2003 345/46 |

FOREIGN PATENT DOCUMENTS

| | | |
|---|---|---|
| JP | S60-157241 A | 8/1985 |
| JP | S61-145851 A | 7/1986 |
| JP | H02-058357 A | 2/1990 |
| JP | H02-222565 A | 9/1990 |
| JP | H09-246430 A | 9/1997 |
| JP | H11-177006 A | 7/1999 |
| JP | 2000-311970 A | 11/2000 |
| JP | 2000311970 A * | 11/2000 |
| JP | 2003-152136 A | 5/2003 |
| JP | 2011-082383 A | 4/2011 |
| JP | 2014-130875 A | 7/2014 |
| JP | 2014-150204 A | 8/2014 |

OTHER PUBLICATIONS

An Office Action issued by the Japanese Patent Office dated Oct. 31, 2017, which corresponds to Japanese Patent Application No. 2016-571547 and is related to U.S. Appl. No. 15/533,327; with English translation.

International Preliminary Report on Patentability issued in PCT/JP2015/052190, dated Aug. 1, 2017.

An Office Action mailed by the Chinese Patent Office dated Dec. 3, 2018, which corresponds to Chinese Patent Application No. 201580074778.X and is related to U.S. Appl. No. 15/533,327; with English translation.

* cited by examiner

SEMICONDUCTOR MODULE

TECHNICAL FIELD

The present invention relates to semiconductor modules, and particularly, to a semiconductor module for an electric power application.

BACKGROUND ART

The semiconductor module for the electric power application is typically disposed on an insulating substrate and is typically configured such that a sealing gel seals, within a case, semiconductor elements mutually connected through, for instance, a wire. Moisture absorption of the sealing gel and temperature change during the operation of semiconductor module can cause the sealing gel to expand and contract to thus cause damage, such as a broken wire, to a sealed object. Additionally, the sealing gel is detached from, for instance, the insulating substrate to thus degrade insulation properties.

To solve these problems, Patent Document 1, for instance, describes filling a gel filler into the case before placing a plate to be in close contact with the front surface of the filler. This plate suppresses the sway of the gel filler to thus prevent or reduce, for instance, a break in the wire.

PRIOR ART DOCUMENT

Patent Document

Patent Document 1: Japanese Patent Application Laid-Open No. 2000-311970

SUMMARY OF INVENTION

Problem to be Solved by the Invention

The semiconductor module for the electric power application has been recently required to operate under higher temperature. The operation of the semiconductor module under high temperature causes the sealing gel to further expand. Accordingly, an excessive stress applied to the sealed object due to the expansion of the sealing gel needs to be prevented or reduced.

The present invention is made to solve the aforementioned problem. It is an object of the present invention to reduce an excessive stress on a sealed object due to the expansion and contraction of a sealing gel to thus provide a semiconductor module with improved reliability.

Means for Solving the Problem

A first semiconductor module according to the present invention includes: a semiconductor element bonded to a metal pattern on an insulating substrate contained in a case; a sealing gel sealing the insulating substrate and the semiconductor element within the case; and a sealing-gel-expansion suppressing plate disposed in the upper portion of the sealing gel to be at least partially in contact with the sealing gel. The sealing-gel-expansion suppressing plate includes a surface facing the sealing gel and inclined to the upper surface of the sealing gel.

A second semiconductor module according to the present invention includes: a semiconductor element bonded to a metal pattern on an insulating substrate contained in a case; a sealing gel sealing the insulating substrate and the semiconductor element within the case; and a sealing-gel-expansion suppressing plate disposed in the upper portion of the sealing gel to be at least partially in contact with the sealing gel. The sealing gel includes an upper surface having partially different heights in a region in which the sealing-gel-expansion suppressing plate and the sealing gel overlap each other in a plan view.

A third semiconductor module according to the present invention includes: a semiconductor element bonded to a metal pattern on an insulating substrate contained in a case; a sealing gel sealing the insulating substrate and the semiconductor element within the case; a sealing-gel-expansion suppressing plate disposed in the upper portion of the sealing gel; and a buffer material including a lower surface in contact with the sealing gel and an upper surface in contact with the sealing-gel-expansion suppressing plate.

A fourth semiconductor module according to the present invention includes; a semiconductor element bonded to a metal pattern on an insulating substrate contained in a case; a sealing gel sealing the insulating substrate and the semiconductor element within the case; and a sealing-gel-expansion suppressing plate disposed to be in contact with the upper surface of the sealing gel. The upper surface of the sealing gel includes a plurality of holes.

Effects of the Invention

The first semiconductor module according to the present invention is configured such that the sealing-gel-expansion suppressing plate is placed to be inclined to the upper surface of the sealing gel to thus prevent or reduce the generation of an excessive pressure inside the sealing gel when the sealing gel expands. In other words, such placement prevents or reduces the application of an excessive stress to the sealed object. Additionally, the placement of the sealing-gel-expansion suppressing plate prevents the sealing gel from being detached from the sealed object. This improves the reliability of the semiconductor module.

The second semiconductor module according to the present invention is configured such that a region in which the height of the upper surface of the sealing gel is relatively low includes a space that allows the sealing gel to expand upward between the sealing-gel-expansion suppressing plate and the upper surface. Consequently, if the sealing gel expands, the excessive stress on the sealed object would be reduced. Additionally, when the sealing gel further expands to reach the sealing-gel-expansion suppressing plate, the sealing-gel-expansion suppressing plate suppresses the expansion of the sealing gel. This prevents the sealing gel from being detached from, for instance, the insulating substrate. This improves the reliability of the semiconductor module.

The third semiconductor module according to the present invention is configured such that when the sealing gel starts to expand, the buffer material slightly suppresses the expansion at first. This prevents or reduces the excessive stress on the sealed object. When the sealing gel further expands, the sealing-gel-expansion suppressing plate suppresses the expansion of the sealing gel. This prevents the sealing gel from being detached from the sealed object. This improves the reliability of the semiconductor module.

The fourth semiconductor module according to the present invention is configured such that if the sealing gel expands, spaces of the plurality of holes would absorb the expansion. This prevents or reduces the excessive stress on the sealed object. When the sealing gel further expands, the sealing-gel-expansion suppressing plate suppresses the expansion of the sealing gel. This prevents the sealing gel from being detached from the sealed object. This improves the reliability of the semiconductor module.

These and other objects, features, aspects and advantages of the present invention will become more apparent from the following detailed description of the present invention when taken in conjunction with the accompanying drawings.

DESCRIPTION OF EMBODIMENTS

<Prerequisite Technique>

Figure 14:
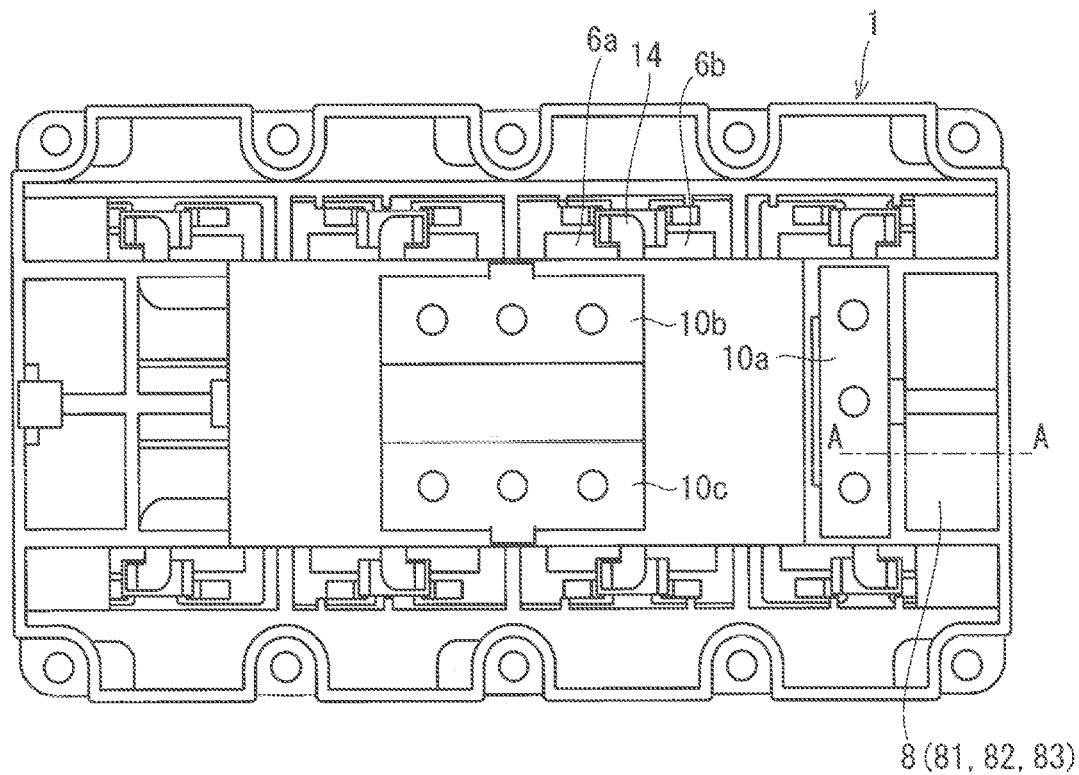
FIG. 14 is a plan view of a semiconductor module according to a prerequisite technique.
Figure 15:
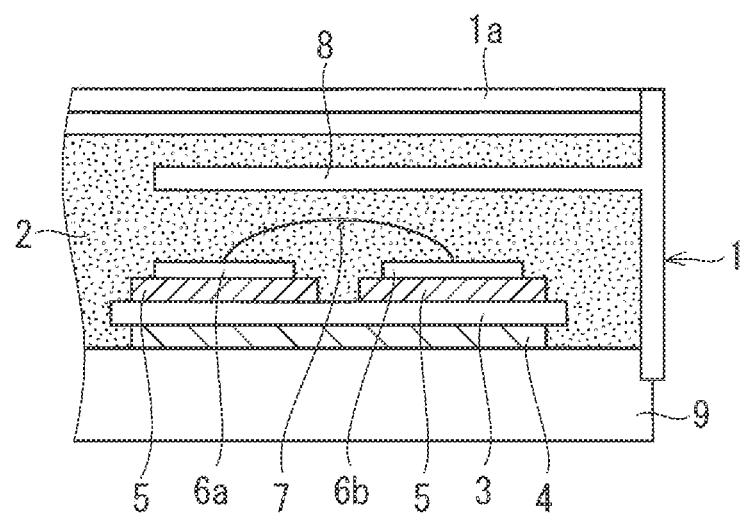
FIG. 15 is a cross-sectional view of the semiconductor module according to the prerequisite technique.

Prior to a description about the embodiments of the present invention, provided is a description of a prerequisite technique for the present invention. FIG. 14 is a plan view of a semiconductor module according to the prerequisite technique. FIG. 15 is a cross-sectional view taken along the line AA in FIG. 14. It is noted that for easy viewing, FIG. 14 does not illustrate a lid 1a of a case 1 and a sealing gel 2.

As illustrated in FIGS. 14 and 15, an insulating substrate 3 is bonded above a metal base plate 9 with a metal material 4 such as solder interposed therebetween. The insulating substrate 3 includes a front surface including a metal pattern 5 made of, for instance, copper. A plurality of semiconductor elements 6a and 6b are bonded on the metal pattern 5. The semiconductor elements 6a and 6b are electrically bonded to each other through, for instance, a wire 7; and the semiconductor elements 6a and 6b are electrically bonded to external electrodes 10a, 10b, and 10c through, for instance, a metal plate 14.

The insulating substrate 3, the semiconductor elements 6a and 6b, and the wire 7 are accommodated in the case 1 whose bottom surface is the base plate 9. The sealing gel 2 is filled inside the case 1. In other words, the sealing gel 2 seals the insulating substrate 3, the semiconductor elements 6a and 6b, and the wire 7. As illustrated in FIG. 15, the case 1 includes an inner wall with a sealing-gel-expansion suppressing plate 8 integrated; and the sealing gel 2 also seals the sealing-gel-expansion suppressing plate 8.

In the prerequisite technique, the sealing-gel-expansion suppressing plate 8 is provided to suppress the expansion of the sealing gel 2. The sealing-gel-expansion suppressing plate 8 always suppresses the expansion of the sealing gel 2 regardless of degrees of the expansion of the sealing gel 2. Thus, if the sealing gel 2 expands so slightly as not to affect a sealed object (e.g., the wire 7), the sealing-gel-expansion suppressing plate 8 suppresses the expansion. As a result, a stress might be applied to the sealed object to thus cause damage to the sealed object, such as a break in the wire 7. The present invention solves the aforementioned problem.

<First Embodiment>

Figure 1:
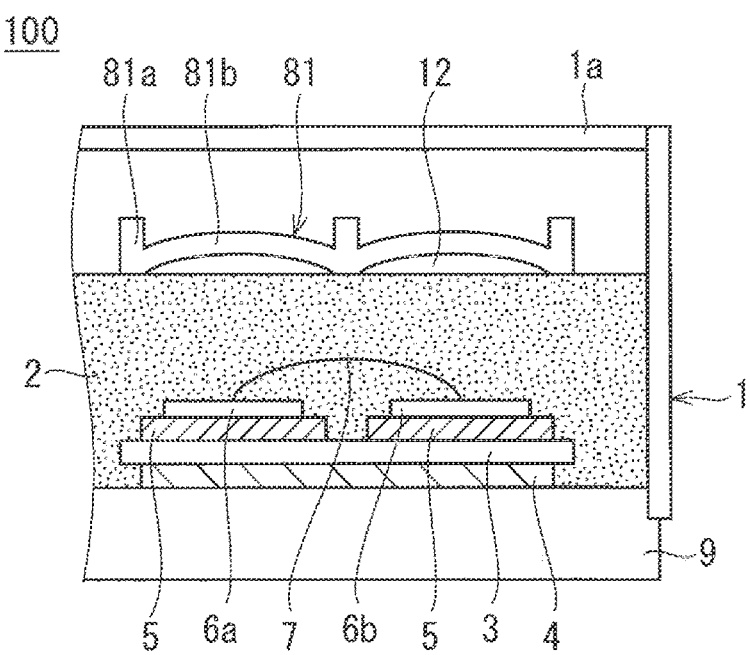
FIG. 1 is a cross-sectional view of a semiconductor module according to a first embodiment.
Figure 2:
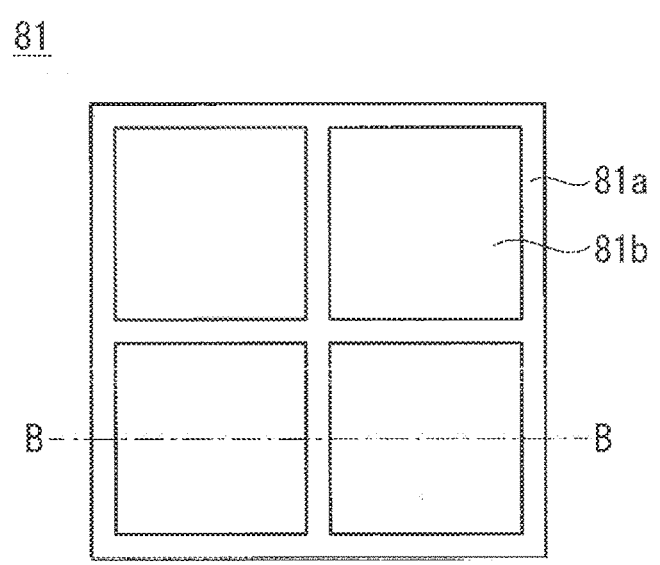
FIG. 2 is a plan view of a sealing-gel-expansion suppressing plate according to the first embodiment.

FIG. 1 is a cross-sectional view of a semiconductor module 100 in a first embodiment. FIG. 2 is a plan view of a sealing-gel-expansion suppressing plate 81 in the first embodiment. A description of a configuration of the semiconductor module 100 in the first embodiment, which is the same as the configuration in the prerequisite technique (FIG. 15) except for a sealing-gel-expansion suppressing plate 81, is omitted. It is noted that FIG. 1 is the cross-sectional view taken along the line AA in the plan view FIG. 14) that is used for the prerequisite technique. It is also noted that a cross section taken along the line BB in FIG. 2 corresponds to a cross section of the sealing-gel-expansion suppressing plate 81 in FIG. 1.

The sealing gel 2 is, for instance, a silicone gel in the first embodiment. The sealing-gel-expansion suppressing plate 81 includes a lattice-shaped frame 81a and an arch 81b that is the inside of the frame 81a, in the first embodiment. As illustrated in FIG. 1, the sealing-gel-expansion suppressing plate 81 is secured to the upper surface of the sealing gel 2 for close contact so as to form a space 12 between the arch 81b and the upper surface of the sealing gel 2.

Thanks to the space 12 formed between the arch 81a and the sealing gel 2, the expansion is not suppressed until the space 12 is filled with the sealing gel 2 if the sealing gel 2 starts to expand. After the sealing gel 2 further expands and then the space 12 is filled with the sealing gel 2, the sealing-gel-expansion suppressing plate 81 suppresses the expansion.

In the first embodiment, the semiconductor elements 6a and 6b are, for instance, insulated gate bipolar transistor (IGBT) and freewheeling diode connected in parallel. The semiconductor elements 6a and 6b are, for instance, silicon (Si) semiconductor elements, and may be silicon carbide (SiC) semiconductor elements capable of operating under high temperature.

In the first embodiment, the sealing-gel-expansion suppressing plate 81 may be secured to or in contact with members other than the sealing gel 2. For instance, the sealing-gel-expansion suppressing plate 81 may be secured to the case 1 on its one side (i.e., the side surface of the frame 81a). Alternatively, the frame 81a of the sealing-gel-expansion suppressing plate 81 may extend toward the lid 1a of the case 1 at the top end of the frame 81a to be in contact with or be secured to the lid 1a of the case 1.

<Effect>

The semiconductor module 100 in the first embodiment includes: the semiconductor elements 6a and 6b bonded to the metal pattern 5 on the insulating substrate 3 included in the case 1; the sealing gel 2 sealing the insulating substrate 3 and the semiconductor elements 6a and 6b within the case 1; and the sealing-gel-expansion suppressing plate 81 disposed in the upper portion of the sealing gel 2 to be at least partially in contact with the sealing gel 2. The sealing-gel-expansion suppressing plate 81 includes a surface facing the sealing gel 2 and inclined to the upper surface of the sealing gel 2.

Thus, placing the sealing-gel-expansion suppressing plate 81 to be inclined to the upper surface of the sealing gel 2 prevents or reduces the generation of an excessive pressure inside the sealing gel 2 when the sealing gel expands. In other words, such placement prevents an excessive stress from being applied to the objects, such as the semiconductor elements 6a and 6b, and wire 7, which are sealed by the sealing gel 2. Additionally, the placement of the sealing-gel-expansion suppressing plate 81 prevents the sealing gel 2 from being detached from, for instance, the insulating substrate 3. Consequently, the first embodiment enables prevention or reduction of both damage to the sealed object such as the wire 7 and the detachment of the sealing gel 2. This improves the reliability of the semiconductor module 100 under high temperature.

The sealing-gel-expansion suppressing plate 81, which is included in the semiconductor module 100 in the first embodiment, has an arch-Shaped cross section.

In the first embodiment, when the sealing gel 2 expands enough to fill the space 12 of the arch 81b, the sealing-gel-expansion suppressing plate 81 suppresses the expansion. In other words, when the sealing gel 2 expands so slightly as not to affect the sealed object (e.g., the semiconductor elements 6a and 6b, and wire 7), the space 12 absorbs a corresponding expansion, and thus the sealing-gel-expansion suppressing plate 81 does not suppress the expansion. Consequently, the generation of the excessive stress in the sealed object resulting from suppressing the expansion of the sealing gel 2 is prevented or reduced. Further, when the sealing gel 2 expands enough to fill the space 12, the sealing-gel-expansion suppressing plate 81 suppresses the expansion. This prevents or reduces the detachment of the sealing gel 2 from, for instance, the insulating substrate 3 because of an excessive expansion of the sealing gel 2, As described above, the first embodiment enables the prevention or reduction of both damage to the sealed object and the detachment of the sealing gel 2. This improves the reliability of the semiconductor module 100 under high temperature.

The semiconductor module 100 in the first embodiment is configured such that the metal pattern 5 is made of copper and that the metal pattern 5 includes a front surface that is not covered with a material other than copper. A metal pattern 5 made of non-plated copper is typically well-bonded to a copper electrode and a copper wire. The metal pattern 5 made of non-plated copper is, however, easy to be detached from the sealing gel 2. The first embodiment enables the prevention or reduction of the detachment of the sealing gel 2 from a sealed object. Thus, a non-plated copper pattern, if provided as the metal pattern 5, would not easily result in the detachment.

The semiconductor module 100 in the first embodiment is configured such that the semiconductor elements 6a and 6b are the SiC semiconductor elements. Thus, it is more effective to use the SiC semiconductor elements, which enable a high-temperature operation, in the first embodiment that improves the reliability against the expansion of the sealing gel 2.

<Second Embodiment>

Figure 3:
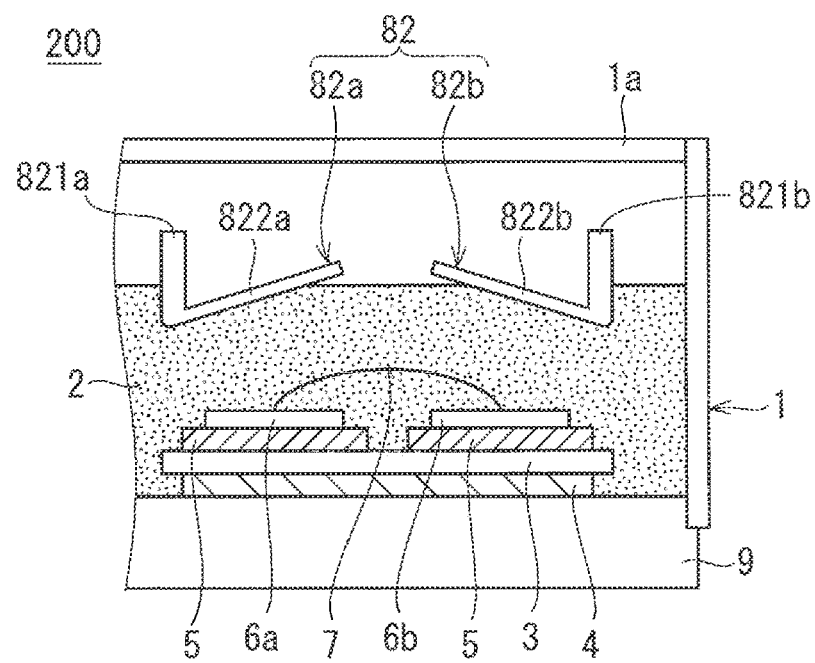
FIG. 3 is a cross-sectional view of a semiconductor module according to a second embodiment.
Figure 4:
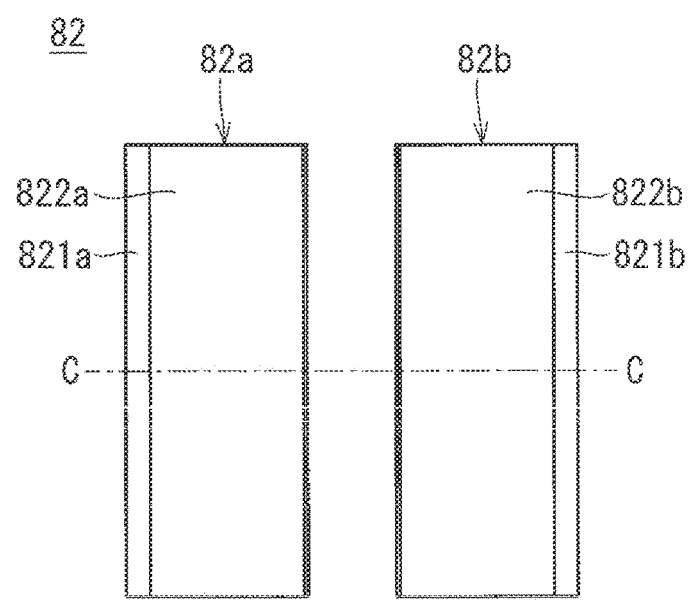
FIG. 4 is a plan view of a sealing-gel-expansion suppressing plate according to the second embodiment.

FIG. 3 is a cross-sectional view of a semiconductor module 200 in a second embodiment. FIG. 4 is a plan view of a sealing-gel-expansion suppressing plate 82 in the second embodiment. A description of a configuration of the semiconductor module 200, which is the same as the configuration in the first embodiment (FIG. 1) except for the sealing-gel-expansion suppressing plate 82, is omitted.

FIG. 3 is the cross-sectional view taken along the line AA in the plan view (FIG. 14) that is used for the prerequisite technique. Additionally, a cross section in the line CC in FIG. 4 corresponds to a cross section of the sealing-gel-expansion suppressing plate 82 in FIG. 3.

The sealing-gel-expansion suppressing plate 82 includes first and second sealing-gel-expansion suppressing plates 82a and 82b. As illustrated in FIG. 3, the first and second sealing-gel-expansion suppressing plates 82a and 82b are disposed so that inclined portions 822a and 822b are each inclined to the upper surface of the sealing gel 2. The first and second sealing-gel-expansion suppressing plates 82a and 82b are disposed to face each other to form an inverted V-shape.

In the second embodiment, the first and second sealing-gel-expansion suppressing plate 82a and 82b may be each secured to the case 1 at their ends 821a and 821b. Alternatively, the first and second sealing-gel-expansion suppressing plates 82a and 82b may each extend toward the lid 1 of the case 1 at their ends 821a and 821b to be in contact with or secured to the lid 1a of the case 1.

<Effect>

The semiconductor module 200 in the second embodiment is configured such that the sealing-gel-expansion suppressing plate 82 has an inverted V-shaped cross section.

Thus, the sealing-gel-expansion suppressing plate 82 is disposed to be inclined to the upper surface of the sealing gel 2 when compared with the corresponding one in the prerequisite technique. Such a configuration prevents or reduces the expansion of the sealing gel 2 more gently than the configuration in the prerequisite technique in which the sealing-gel-expansion suppressing plate 8 is disposed to be horizontal to the upper surface of the sealing gel 2. This prevents or reduces the generation of the excessive pressure inside the sealing gel 2. In other words, this prevents or reduces the application of the excessive stress to the objects, such as the semiconductor elements 6a, 6b, and wire 7, which are sealed by the sealing gel 2. Additionally, providing the sealing-gel-expansion suppressing plate 82 prevents the sealing gel 2 from being detached from, for instance, the insulating substrate 3. As described above, the second embodiment enables the prevention or reduction of both damage to the sealed object and detachment of the sealing gel 2. This improves the reliability of the semiconductor module 200 under high temperature.

<Third Embodiment>

Figure 5:
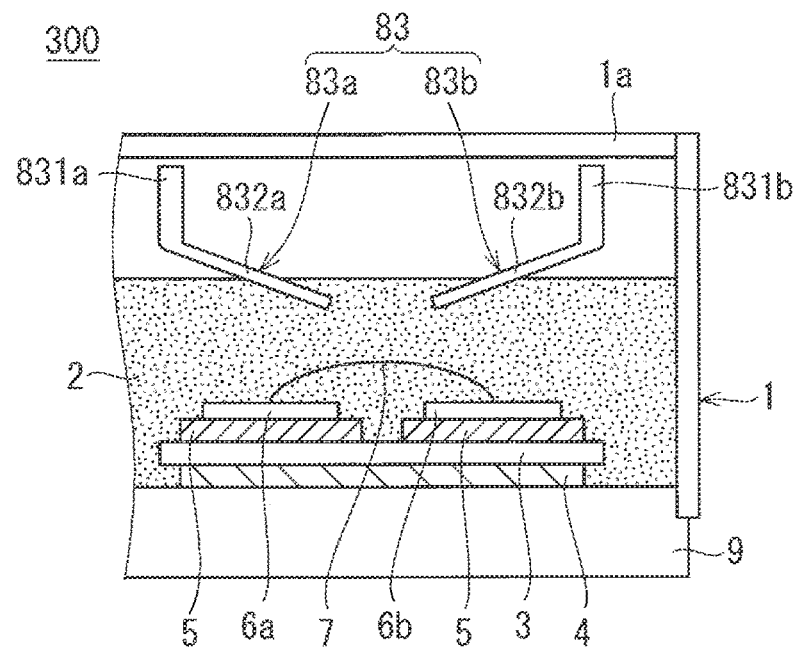
FIG. 5 is a cross-sectional view of a semiconductor module according to a third embodiment.
Figure 6:
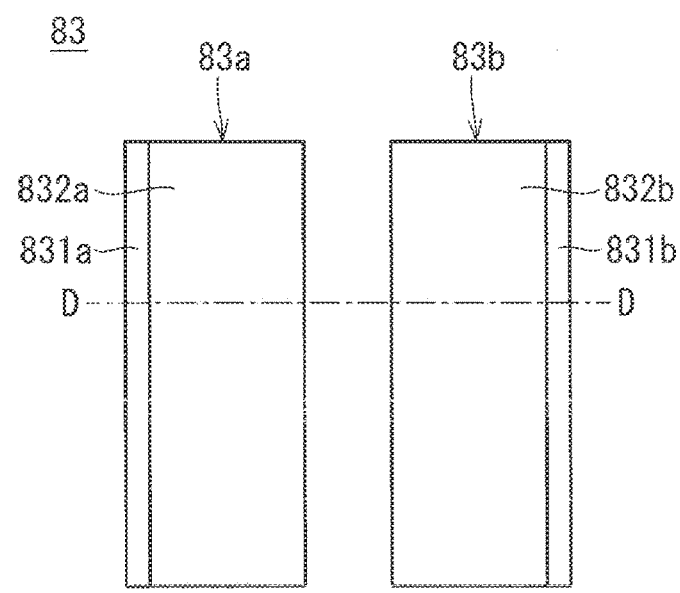
FIG. 6 is a plan view of a sealing-gel-expansion suppressing plate according to the third embodiment.

FIG. 5 is a cross-sectional view of a semiconductor module 300 in a third embodiment. FIG. 6 is a plan view of a sealing-gel-expansion suppressing plate 83 in the third embodiment. A description of a configuration of the semiconductor module 300, which is the same as the configuration in the first embodiment (FIG. 1) except for the sealing-gel-expansion suppressing plate 83, is omitted.

FIG. 5 is the cross-sectional view taken along the line AA in the plan view (FIG. 14) that is used for the prerequisite technique. Additionally, a cross section in the line DD in FIG. 6 corresponds to a cross section of the sealing-gel-expansion suppressing plate 83 in FIG. 5.

The sealing-gel-expansion suppressing plate 83 includes first and second sealing-gel-expansion suppressing plates 83a and 83b. As illustrated in FIG. 5, the first and second sealing-gel-expansion suppressing plates 83a and 83b are disposed so that inclined portions 832a and 832b are each inclined to the upper surface of the sealing gel 2. The first and second sealing-gel-expansion suppressing plates 83a and 83b are disposed to face each other to form a V-shape.

In the third embodiment, the first and second sealing-gel-expansion suppressing plates 83a and 83b may be each secured to the case 1 at their ends 831a and 831b. Alternatively, the first and second sealing-gel-expansion suppressing plates 83a and 83b may each extend toward the lid 1a of the case 1 at their ends 831a and 831b to be in contact with or secured to the lid 1a of the case 1.

<Effect>

The semiconductor module 300 in the third embodiment is configured such that the sealing-gel-expansion suppressing plate 83 has a V-shaped cross section.

Thus, the sealing-gel-expansion suppressing plate 83 is disposed to be inclined to the upper surface of the sealing gel 2 when compared with the corresponding one in the prerequisite technique. Such a configuration prevents or reduces the expansion of the sealing gel 2 more gently than the configuration in the prerequisite technique, in which the sealing-gel-expansion suppressing plate 8 is disposed to be horizontal to the upper surface of the sealing gel 2. This prevents or reduces the generation of the excessive pressure inside the sealing gel 2. In other words, this prevents or reduces the application of the excessive stress to the semiconductor element 6a, 6b and wire 7, which are sealed by the sealing gel 2. Additionally, providing the sealing-gel-expansion suppressing plate 83 prevents the sealing gel 2 from being detached from, for instance, the insulating substrate 3. As described above, the third embodiment enables the prevention or reduction of both damage to the sealed object and detachment of the sealing gel 2. This improves the reliability of the semiconductor module 300 under high temperature, <Fourth Embodiment>

Figure 7:
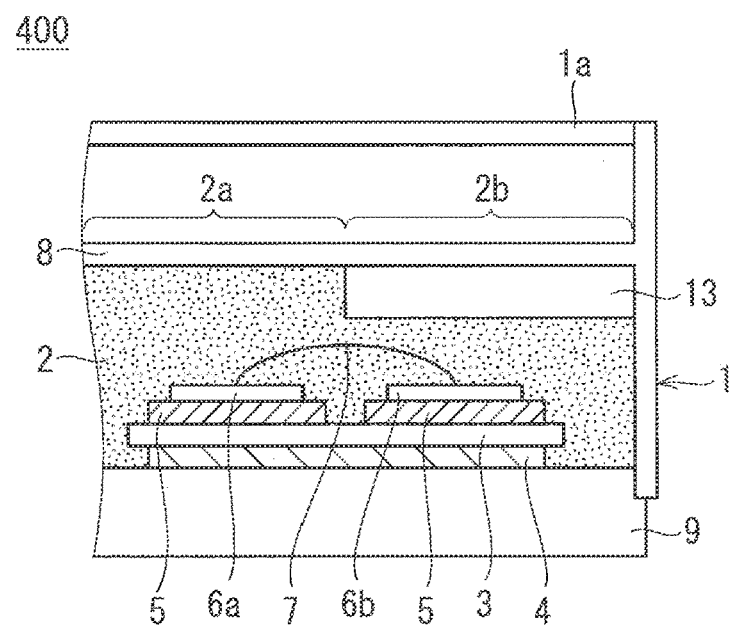
FIG. 7 is a cross-sectional view of a semiconductor module according to a fourth embodiment.

FIG. 7 is a cross-sectional view of a semiconductor module 400 in a fourth embodiment. FIG. 7 is the cross-sectional view taken along the line AA in the plan view (FIG. 14) that is used for the prerequisite technique.

The semiconductor module 400 in the fourth embodiment is configured such that the height of the upper surface of the sealing gel 2 is changed in a region overlapping the sealing-gel-expansion suppressing plate 8 in a plan view.

For instance, a region 2b where the stress due to the expansion of the sealing gel 2 is applied to thus easily cause a broken wire is configured such that the upper surface of the sealing gel 2 is positioned to be so low that the sealing gel 2 is not in contact with the sealing-gel-expansion suppressing plate 8. Meanwhile, a region 2a other than the region 2b is configured such that the upper surface of the sealing gel 2 is positioned to be so high that the sealing gel 2 is in contact with the sealing-gel-expansion suppressing plate 8. A description of the other configuration, which is the same as the configuration in the prerequisite technique (FIG. 15), is omitted.

<Effect>

The semiconductor module 400 in the fourth embodiment includes: the semiconductor elements 6a and 6b bonded to the metal pattern 5 on the insulating substrate 3 included in the case 1; the sealing gel 2 sealing the insulating substrate 3 and the semiconductor elements 6a and 6b within the case 1; and the sealing-gel-expansion suppressing plate 8 disposed in the upper portion of the sealing gel 2 to be at least partially in contact with the sealing gel 2. The sealing gel 2 includes the upper surface having partially different heights in a region in which the sealing-gel-expansion suppressing plate 8 and the sealing gel 2 overlap each other in a plan view.

Thus, the region 2b, in which the upper surface of the sealing gel 2 is positioned to be low, includes a space 13 that allows the sealing gel 2 to expand upward. Consequently, if the sealing gel 2 expands in the region 2b, the excessive stress on the sealed object (e.g., semiconductor elements 6a and 6b, and the wire) would be reduced. Additionally, when the sealing gel 2 further expands in the region 2b to reach the sealing-gel-expansion suppressing plate 8, the sealing-gel-expansion suppressing plate 8 suppresses the expansion of the sealing gel 2. This prevents the sealing gel 2 form being detached from, for instance, the insulating substrate 3.

As described above, the fourth embodiment enables the prevention or reduction of both damage to the sealed object and detachment of the sealing gel 2. This improves the reliability of the semiconductor module 400 under high temperature.

<Fifth Embodiment>

Figure 8:
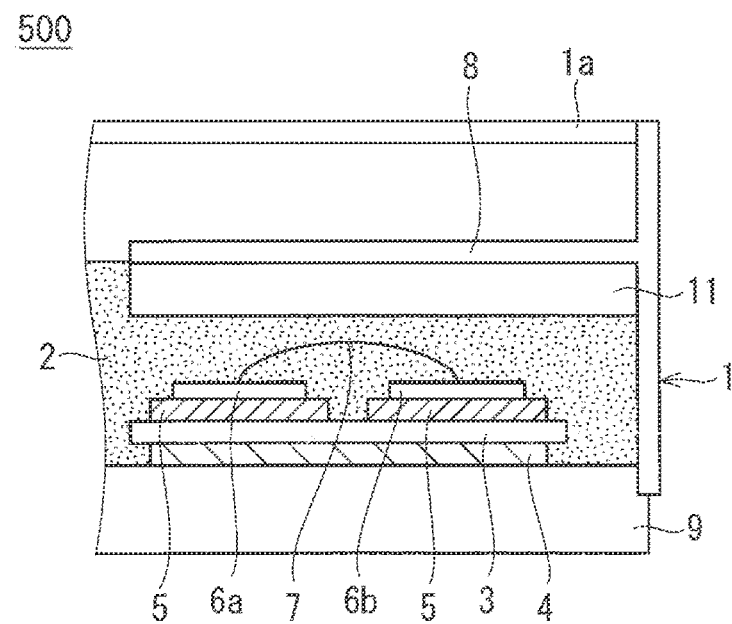
FIG. 8 is a cross-sectional view of a semiconductor module according to a fifth embodiment.
Figure 9:
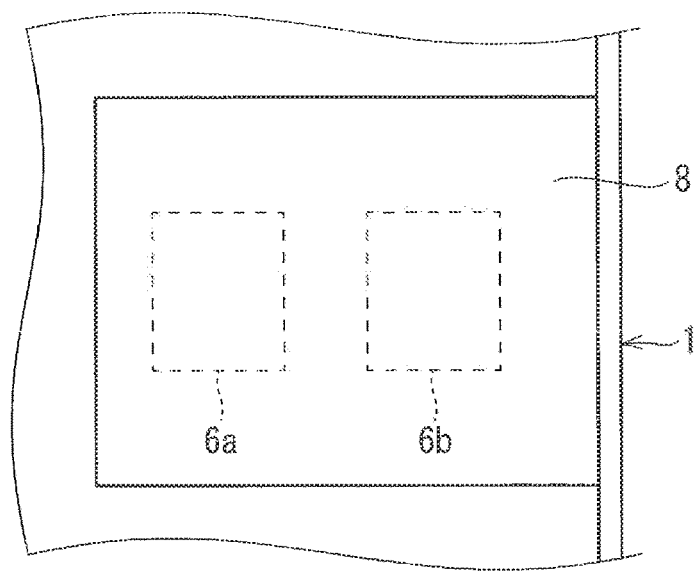
FIG. 9 is a plan view of a sealing-gel-expansion suppressing plate according to the fifth embodiment.

FIG. 8 is a cross-sectional view of a semiconductor module 500 in a fifth embodiment. FIG. 9 is a plan view of a positional relationship between the sealing-gel-expansion suppressing plate 8 and case 1 in the fifth embodiment. It is noted that FIG. 8 is the cross-sectional view taken along the ling AA in the plan view (FIG. 14) that is used for the prerequisite technique.

In the fifth embodiment, a buffer material 11 is disposed between the upper surface of the sealing gel 2 and the lower surface of the sealing-gel-expansion suppressing plate 8. The sealing-gel-expansion suppressing plate 8 includes one side integrated to the case 1 Additionally, the sealing-gel-expansion suppressing plate 8 and the case 1. are separate members, and the sealing-gel-expansion suppressing plate 8 and the case 1 may be secured, for instance, with an adhesive.

The buffer material 11 is made of a material having a smaller Young's modulus than the sealing-gel-expansion suppressing plate 8. An example of the buffer material 11 is a silicone rubber. A description of the other configuration, which is the same as the configuration of the prerequisite technique (FIG. 15), is omitted.

When the sealing gel 2 starts to expand, the buffer material 11 slightly suppresses the expansion of the sealing gel 2 at first. Then, when the sealing gel 2 continues to further expand, the sealing-gel-expansion suppressing plate 8 whose Yong's modulus is larger than that of the buffer material 11 greatly suppresses the expansion of the sealing gel 2.

<Effect>

The semiconductor module 500 in the fifth embodiment includes: the semiconductor elements 6a and 6b bonded to the metal pattern 5 on the insulating substrate 3 included in the case 1; the sealing gel 2 sealing the insulating substrate 3 and the semiconductor elements 6a and 6b within the case 1; the sealing-gel-expansion suppressing plate 8 disposed in the upper portion of the sealing gel 2; and the buffer material 11 including a lower surface in contact with the sealing gel 2 and an upper surface in contact with the sealing-gel-expansion suppressing plate 8.

Thus, when the sealing gel 2 starts to expand, the buffer material 11 slightly suppresses the expansion at first. This prevents or reduces the excessive stress on the sealed object (e.g., the semiconductor elements 6a and 6b, and the wire). When the sealing gel 2 further expands, the sealing-gel-expansion suppressing plate 8 suppresses the expansion of the sealing gel 2. This prevents the sealing gel 2 from being detached from, for instance, the insulating substrate 3. As described above, the fifth embodiment enables the prevention or reduction of both damage to the sealed object and the detachment of the sealing gel 2. This improves the reliability of the semiconductor module 500 under high temperature.

<Sixth Embodiment>

Figure 10:
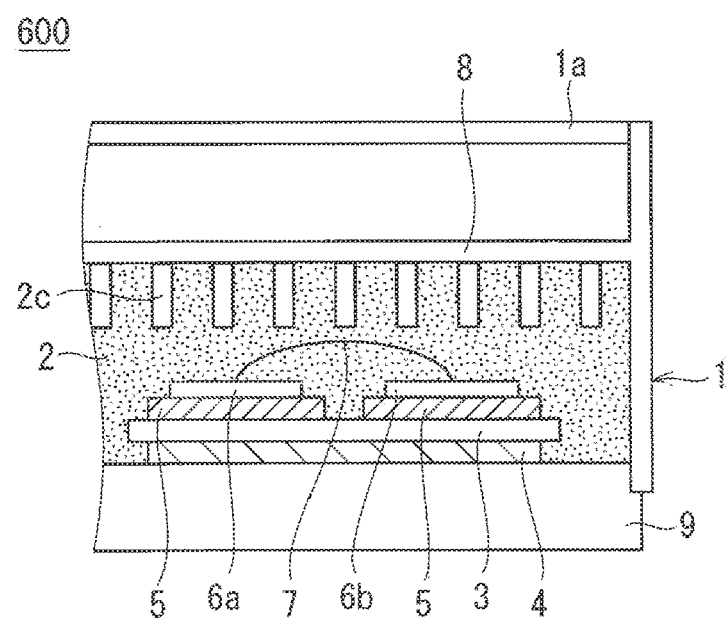
FIG. 10 is a cross-sectional view of a semiconductor module according to a sixth embodiment.
Figure 11:
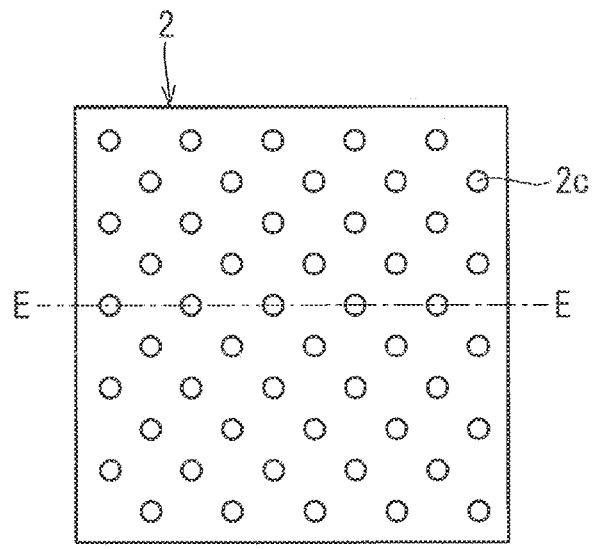
FIG. 11 is a plan view of sealing-gel-expansion suppressing plate according to the sixth embodiment.

FIG. 10 is a cross-sectional view of a semiconductor module 600 in a sixth embodiment. FIG. 11 is a plan view of the sealing gel 2 in the sixth embodiment. A description of a configuration of the semiconductor module 600, which is the same as the configuration in the prerequisite technique (FIG. 15) except for the sealing gel 2, is omitted.

FIG. 10 is the cross-sectional view taken along the line AA in the plan view (FIG. 14) that is used for the prerequisite technique. Additionally, a cross section taken along the line EE in FIG. 11 corresponds to a cross section of the sealing gel 2 in FIG. 10.

As illustrated in FIGS. 10 and 11, the semiconductor module 600 is configured such that the sealing gel 2 includes a plurality of holes 2c on its upper surface. The holes 2c are cylindrical holes, for instance. The sealing gel 2 includes the sealing-gel-expansion suppressing plate 8 on its upper surface. The upper surface of the sealing gel 2 and the lower surface of the sealing-gel-expansion suppressing plate 8 are in. contact with each other.

<Effect>

The semiconductor module 600 in the sixth embodiment includes: the semiconductor elements 6a and 6b bonded to the metal pattern 5 on the insulating substrate 3 included in the case 1; the sealing gel 2 sealing the insulating substrate 3 and the semiconductor elements 6a and 6b within the case 1; and the sealing-gel-expansion suppressing plate 8 disposed to be in contact with the upper surface sealing gel 2. The upper surface of the sealing gel 2 includes the plurality of holes 2c.

Thus, if the sealing gel 2 expands, spaces of the holes 2c would absorb the expansion. This prevents or reduces the excessive stress on the sealed object (e.g., the semiconductor elements 6a and 6b, and the wire). When the sealing gel 2 further expands, the sealing-gel-expansion suppressing plate 8 suppresses the expansion of the sealing gel 2. This prevents the sealing gel 2 from being detached from, for instance, the insulating substrate 3.

As described above, the sixth embodiment enables the prevention or reduction of both damage to the sealed object and detachment of the sealing gel 2. This improves the reliability of the semiconductor module 600 under high temperature.

The semiconductor module 600 in the sixth embodiment is configured such that the holes 2c are the cylindrical holes.

Thus, the holes 2c, which are cylindrical, uniformly absorb pressures from every direction in a plan view when the sealing gel 2 expands. Consequently, the excessive stress on the sealed object (e.g., the semiconductor element 6a and 6b, and the wire) is prevented or reduced. This improves the reliability of the semiconductor module 600 under high temperature.

<Seventh Embodiment>

Figure 12:
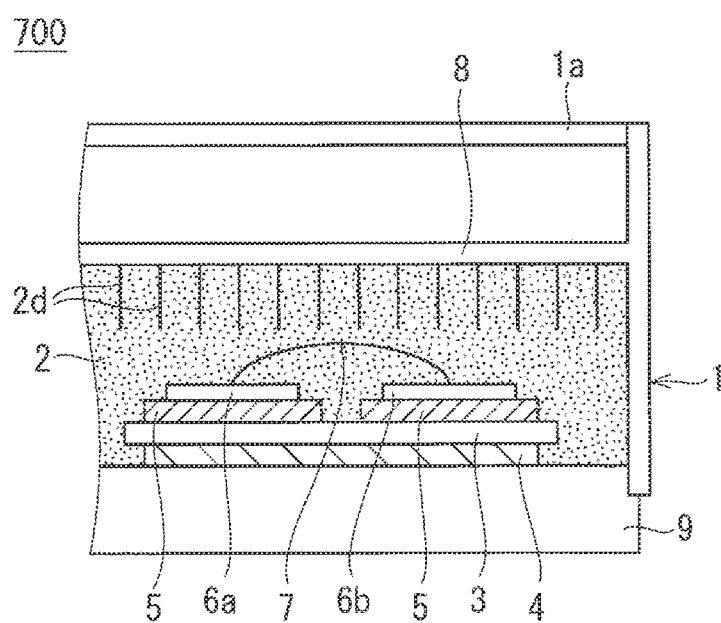
FIG. 12 is a cross-sectional view of a semiconductor module according to a seventh embodiment.
Figure 13:
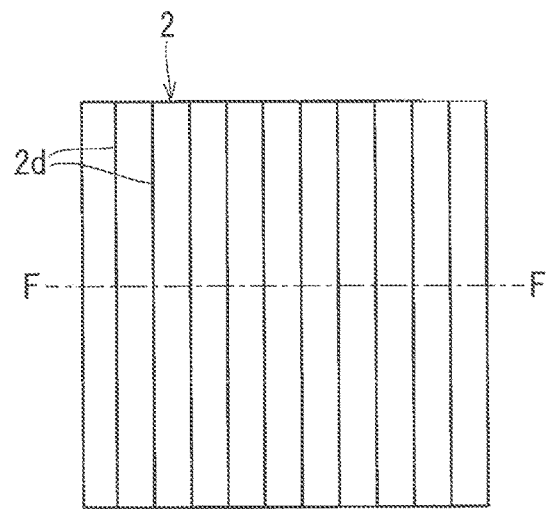
FIG. 13 is a plan view of a sealing-gel-expansion suppressing plate according to the seventh embodiment.

FIG. 12 is a cross-sectional view of a semiconductor module 700 in a seventh embodiment. FIG. 13 is a plan view of the sealing gel 2 in the seventh embodiment. A description of a configuration of the semiconductor module 700, which is the same as the configuration in the prerequisite technique (FIG. 15) except for the sealing gel 2, is omitted.

FIG. 12 is the cross-sectional view taken along the line AA in the plan view (FIG. 14) that is used for the prerequisite technique. Additionally, a cross section taken along the line FF in FIG. 13 corresponds to a cross section of the sealing gel 2 in FIG. 12.

As illustrated in FIGS. 12 and 13, the semiconductor module 700 is configured such that the sealing gel 2 includes a plurality of cut holes 2d on its upper surface. The sealing gel 2 includes the sealing-gel-expansion suppressing plate 8 on its upper surface. The upper surface of the sealing gel 2 and the lower surface of the sealing-gel-expansion suppressing plate 8 are in contact with each other.

As illustrated in FIG. 13, the plurality of cut holes 2d are provided in parallel with each other.

<Effect>

The semiconductor module 700 in the seventh embodiment is configured such that the holes are the cut holes 2d. Accordingly, the sealing gel 2 includes the plurality of cut holes 2d on its upper surface, and thus the cut holes 2d enlarge when the sealing gel 2 expands to thus release the pressure within the sealing gel 2 to the upper surface of sealing gel 2. Consequently, the excessive stress on the sealed object (e.g., the semiconductor element 6a and 6b, and the wire) is prevented or reduced. This improves the reliability of the semiconductor module 700 under high temperature.

While the invention has been shown and described in detail, the foregoing description is in all aspects illustrative and not restrictive. It is therefore understood that numerous modifications and variations can be devised without departing from the scope of the invention.

DESCRIPTION OF REFERENCE NUMERALS 1 case, 2 sealing gel, 2a and 2b region, 2c hole, 2d cut hole, 3 insulating substrate, 4 metal material, 5 metal pattern, 6a and 6b semiconductor element, 7 wire, 8, 81, 82, and 83 sealing-gel-expansion suppressing plate, 82a and 83a first sealing-gel-expansion suppressing plate, 82b and 83b second sealing-gel-expansion suppressing plate, 9 base plate, 10a, 10b, and 10c external electrode, 11 buffer material, 12 and 13 space, 14 metal plate, 100, 200, 300, 400, 500, 600, and 700 semiconductor module, 821a, 821b, 831a, and 831b end, 822a, 822b, 832a, and 832b inclined portion.

The invention claimed is:

1. A semiconductor module comprising:
a semiconductor element bonded to a metal pattern on an insulating substrate contained in a case;
a sealing gel sealing said insulating substrate and said semiconductor element within said case; and
a sealing-gel-expansion suppressing plate disposed in an upper portion of said sealing gel to be at least partially in contact with said sealing gel,
wherein said sealing-gel-expansion suppressing plate includes a surface facing said sealing gel and inclined to an upper surface of said sealing gel, and
wherein said case includes a lid closing an opening of said case, and includes a space between said lid and said upper surface of said sealing gel, said sealing-gel-expansion suppressing plate being within said space separate from said lid with a portion of said space being between said lid and an upper surface of said sealing-gel-expansion suppressing plate facing said lid.

2. The semiconductor module according to claim 1, wherein said sealing-gel-expansion suppressing plate has an arch-shaped cross section.

3. The semiconductor module according to claim 1, wherein said sealing-gel-expansion suppressing plate has an inverted V-shaped cross section.

4. The semiconductor module according to claim 1, wherein said sealing-gel-expansion suppressing plate has a V-shaped cross section.

5. The semiconductor module according to claim 1,
wherein said metal pattern is made of copper, and includes a non-plated front surface.

6. The semiconductor module according to claim 1, wherein said semiconductor element is a SiC semiconductor element.

7. A semiconductor module comprising:
a semiconductor element bonded to a metal pattern on an insulating substrate contained in a case;
a sealing gel sealing said insulating substrate and said semiconductor element within said case; and
a sealing-gel-expansion suppressing plate disposed to be in contact with an upper surface of said sealing gel,
wherein said upper surface of said sealing gel includes a plurality of holes opening toward said sealing-gel-expansion suppressing plate.

8. The semiconductor module according to claim 7, wherein said holes are cylindrical holes.

9. The semiconductor module according to claim 7, wherein said holes are cut holes.

10. The semiconductor module according to claim 9, wherein said cut holes enlarge when said sealing gel expands, and close when said sealing gel does not expand.

11. The semiconductor module according to claim 7,
wherein said metal pattern is made of copper, and includes a non-plated front surface.

12. The semiconductor module according to claim 7, wherein said semiconductor element is a SiC semiconductor element.

13. The semiconductor module according to claim 7, wherein said sealing-gel-expansion suppressing plate covers said holes.

14. A semiconductor module comprising:
a semiconductor element bonded to a metal pattern on an insulating substrate contained in a case;
a sealing gel sealing said insulating substrate and said semiconductor element within said case; and
a sealing-gel-expansion suppressing plate disposed in an upper portion of said sealing gel to be at least partially in contact with said sealing gel,
wherein said sealing-gel-expansion suppressing plate includes a surface facing said sealing gel and inclined to an upper surface of said sealing gel,
wherein said case includes a lid closing an opening of said case, and includes a space between said lid and said upper surface of said sealing gel, and
wherein said sealing-gel-expansion suppressing plate is within said space and positioned such that a portion of said upper surface of said sealing gel outside of a perimeter of said sealing-gel-expansion suppressing plate is exposed via said space to a surface of said lid facing said upper surface of said sealing gel.

* * * * *